(12) United States Patent
Attah et al.

(10) Patent No.: US 9,843,330 B1
(45) Date of Patent: Dec. 12, 2017

(54) DIGITAL SECONDARY CONTROL LOOP FOR VOLTAGE CONVERTER

(71) Applicant: Apple Inc., Cupertino, CA (US)

(72) Inventors: Hubert Attah, Santa Clara, CA (US); Jay B. Fletcher, Austin, TX (US); Erick O. Torres, Austin, TX (US); Fabio Gozzini, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/272,526

(22) Filed: Sep. 22, 2016

(51) Int. Cl.
*H03K 21/02* (2006.01)
*H03K 19/21* (2006.01)

(52) U.S. Cl.
CPC ........... *H03K 21/026* (2013.01); *H03K 19/21* (2013.01)

(58) Field of Classification Search
CPC ........... H03K 17/063; H03K 17/08104; H03K 17/162; H03K 17/284; H03K 17/567; H03K 17/661; H03K 17/687; H03K 19/0005; H03K 5/01; H03K 5/1515; H03K 7/08
USPC .......................... 327/108, 109, 110, 111, 112
See application file for complete search history.

(56) References Cited

U.S. PATENT DOCUMENTS

| | | | |
|---|---|---|---|
| 5,254,883 A | 10/1993 | Horowitz | |
| 5,734,278 A * | 3/1998 | Lenihan, III | H02M 3/158 327/110 |
| 6,047,346 A | 4/2000 | Lau | |
| 6,351,162 B1 * | 2/2002 | Schwartz | H03K 17/64 327/110 |
| 7,352,234 B2 | 4/2008 | Garrett, Jr. | |
| 8,634,452 B2 | 1/2014 | Zerbe | |
| 9,386,653 B2 | 7/2016 | Kuo | |
| 2015/0115923 A1 * | 4/2015 | Shao | H02M 3/158 323/283 |

* cited by examiner

*Primary Examiner* — John Poos
(74) *Attorney, Agent, or Firm* — Meyertons, Hood, Kivlin, Kowert & Goetzel, P.C.

(57) ABSTRACT

An apparatus is disclosed, including a driver circuit, a comparator circuit, and a counter circuit. The driver circuit may be configured to source a current to a load circuit. The comparator circuit may be configured to perform a comparison of a reference voltage to a voltage across the load circuit. The counter circuit may be configured to modify a digital count value based on the comparison. The driver circuit may be further configured to adjust a value of the current using the digital count value.

20 Claims, 10 Drawing Sheets

DIGITAL SECONDARY CONTROL LOOP FOR VOLTAGE CONVERTER

BACKGROUND

Technical Field

Embodiments described herein are related to the field of integrated circuit implementation, and more particularly to the implementation of buck converter circuits.

Description of the Related Art

Computing systems may include one or more systems-on-a-chip (SoC), each of which may integrate a number of different functions onto a single integrated circuit. With numerous functions included in a single integrated circuit, chip count may be kept low in mobile computing systems, such as tablets, for example, which may result in reduced assembly costs, and a smaller form factor for such mobile computing systems. Many functional blocks, such as memories, timers, serial ports, phase-locked loops (PLLs), analog-to-digital converters (ADCs) and more, may be included in an SoC. Various SoCs and/or various functional blocks on a given SoC may utilize power signals of different voltage levels. Since computing systems may include a single power source with a given output voltage level, one or more voltage converters or voltage regulators may be used to generate the power signals of different voltage levels.

Designers implementing voltage regulating circuits in a given computing system may select from among various types of voltage converting and voltage regulating circuits. Types of circuits for converting a DC power signal with a first voltage to a DC power signal with a second voltage include linear regulators and switching regulators. Buck converters, sometimes also referred to as buck regulators, are one example of a switching regulator.

SUMMARY OF THE EMBODIMENTS

Various embodiments of a voltage conversion apparatus are disclosed. Broadly speaking, an apparatus, a system, and a method are contemplated in which the apparatus includes a driver circuit, a comparator circuit, and a counter circuit. The driver circuit may be configured to source a current to a load circuit. The comparator circuit may be configured to perform a comparison of a reference voltage to a voltage across the load circuit. The counter circuit may be configured to modify a digital count value based on the comparison. The driver circuit may be further configured to adjust a value of the current using the digital count value.

In a further embodiment, the counter circuit may be further configured to store a specific digital count value in response to an indication from the load circuit that at least a portion of the load circuit is switching from a first operating state to a second operating state. In another embodiment, the counter circuit may be further configured to read the stored specific digital count value in response to an indication from the load circuit that the at least a portion of the load circuit is switching from the second operating state to the first operating state. The counter circuit may also be configured to replace a present digital count value with the stored specific digital count value.

In one embodiment, the counter circuit may be further configured to operate in a first mode in response to a determination that a magnitude of a difference between the reference voltage and the voltage across the load circuit is less than a threshold difference, and to otherwise operate in a second mode. In a further embodiment, to operate in the first mode, the counter circuit may also be configured to modify a first digital count value based on the comparison, and to maintain a constant value of a second digital count value. The counter circuit may be further configured to concatenate the first digital count value with a fixed constant value, and to send the concatenated first digital count value to the driver circuit for use in adjusting the value of the current.

In another embodiment, to operate in the second mode, the counter circuit may also be configured to maintain a constant value of the first digital count value. The counter circuit may also be configured to modify the second digital count value in a manner based on the comparison, and to send the second digital count value to the driver circuit for use in adjusting the value of the current. In a further embodiment, to operate in the second mode, the counter circuit may be further configured to maintain a constant value of the second digital count value in response to a determination that a value of a received control signal has toggled since a most recent modification of the second digital count value.

BRIEF DESCRIPTION OF THE DRAWINGS

The following detailed description makes reference to the accompanying drawings, which are now briefly described.

Figure 1:
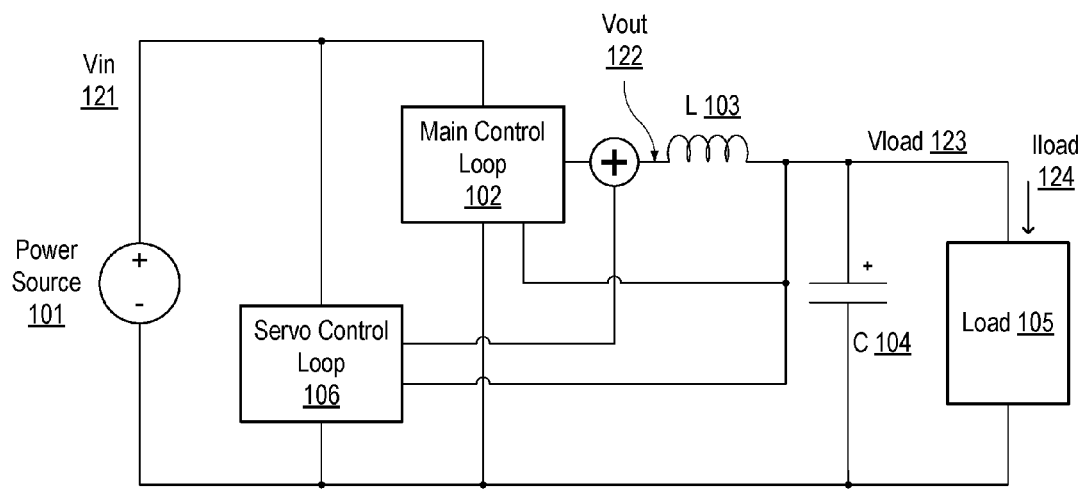
FIG. 1 illustrates a block diagram of an embodiment of a voltage converting system.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

Voltage conversion circuits may be found in many computing systems providing a power supply signal of a particular voltage level to one or more integrated circuits (ICs) or to a subset of circuits in a given IC. Buck converters are one type of voltage conversion circuit that may be used to generate a signal with a given voltage level. Buck converters receive an input power signal (Vin) and generate an output power signal (Vout) with a reduced voltage level. To reduce the voltage level of Vin to a desired voltage level on Vout, a buck converter may couple Vin to Vout for given amounts of time via, for example, a switch, a transistor, or another type of transconductance device.

The buck regulator may include one or more control circuits that generate a power signal of a desired voltage level to a load coupled to the output (i.e. ICs or other circuits). Each of these control circuits may generate a signal that enables and disables a respective transconductance device for the given amounts of time. Components such as, e.g., capacitors and inductors may be used to store charge and regulate current during the time periods in which the transistor is off. The voltage level of Vout may be dependent upon an average amount of time that the transistor is on versus off, referred to respectively as the "on time," or "Ton" and the "off time," or "Toff." The control circuit, which is also referred to herein as the "main control loop" or simply "main loop," may generate a pulse-width modulated (PWM) and/or pulse-frequency modulated (PFM) signal with a given frequency. Adjustments may be made to the generated signal over one or more cycles as the main control loop responds to feedback from the Vout signal. For example, a voltage level (Vout) or an amount of current (Tout) going to the load may be monitored, and the PWM/PFM signal may be adjusted based on this feedback to provide more or less power to match a demand from the load.

Increases or decreases in power demand from the load may cause respective decreases or increases in the voltage level of Vout that are difficult for the main control loop to fully match. The main loop may be capable of responding to most of the increased or decreased power demand, but may not be capable of maintaining the desired voltage level of Vout. In some embodiments, a secondary control loop, also referred to herein as a "servo control loop," or simply "servo loop," may be used to respond to sudden large power changes, while the main control loop primarily responds to more gradual changes. One consideration for a servo control loop is the frequency at which the servo loop can respond to changes in power demand. The frequency of the servo control loop may be designed to be less than the frequency of the main control loop, otherwise, if the frequencies of the two control loops are too close, they may cause oscillations on the Vout power signal as both control loops respond to the same feedback, and effectively "double" the response, thereby overcompensating and causing Vout to increase or decrease more than desired.

Some servo control loops utilize resistor and capacitor (RC) circuits to filter out higher frequency changes in Vout or Tout such that the servo loop receives the slower changes. To accomplish this, however, may require an RC circuit with a large time constant. On an IC, manufacturing components with large resistance and capacitance values may be problematic, as such components may consume a relatively large amount of die area compared to other components.

Various embodiments of voltage conversion circuits are described in this disclosure. The embodiments illustrated in the drawings and described below may provide methods and systems for creating digital servo control loops without a need for large time constant RC circuits.

The embodiments illustrated and described herein may employ CMOS circuits. In various other embodiments, however, other suitable technologies may be employed.

Some terms commonly used in reference to SoC designs and CMOS circuits are used in this disclosure. For the sake of clarity, it is noted that "high" or "high logic level" refers to a voltage sufficiently large to turn on a n-channel metal-oxide semiconductor field-effect transistor (MOSFET) and turn off a p-channel MOSFET while "low" or "low logic level" refers to a voltage that is sufficiently small enough to do the opposite. In other embodiments, different technology may result in different voltage levels for "low" and "high."

A block diagram of an embodiment of a voltage converter is shown in FIG. 1. In the illustrated embodiment, Voltage Converter 100 includes Power Source 101 coupled to Main Control Loop 102 and Servo Control Loop 106. Main Control Loop 102 is, in turn, coupled to Inductor (L) 103. L 103 is further coupled to Capacitor (C) 104 and Load 105. Power Signal Vin 121 is generated by Power Source 101 and Power Signal Vout 122 is sourced to a first terminal of L 103. Load 105 receives Vload 123 from a second terminal of L 103. In various embodiments, Voltage Converter 100 may be configured for use in various computing applications such as, e.g., desktop computers, laptop computers, tablet computers, smartphones, or wearable devices.

Power Source 101 may correspond to any suitable power supply, such as, for example, a DC power supply, one or more batteries, a battery charger, or a voltage regulation circuit. Power Source 101, in the illustrated embodiment, generates power supply signal Vin 121 at a first voltage level. Multiple circuits may be coupled to Power Source 101 to receive Vin 121. Some circuits may use a power supply signal with a lower voltage level than the voltage level of Vin 121. Such circuits may, instead receive Vout from Voltage Converter 100.

Main Control Loop 102, in the illustrated embodiment, receives Vin 121, and generates Vout 122 with a desired voltage level. To attain the desired voltage level, Main Control Loop 102 switches a transconductance device, such as, for example, a CMOS transistor, on and off using a control signal, resulting in Vin 121 being coupled to L103 for a portion of an operating time. Main Control Loop 102 receives indications of amounts of current flowing through L 103 and uses this feedback to adjust the control signal to maintain the voltage level of Vout 122 close to the desired level. In some embodiments, Main Control Loop 102 generates Vout 122 utilizing one of two modes, a pulse width modulation (PWM) mode and a pulse frequency modulation (PFM) mode. In PWM mode, Main Control Loop 102 generates the control signal using a fixed frequency PWM signal corresponding to the Ton and Toff times. The width of the pulse corresponds to an amount of current sourced to L 103, the wider the pulse, the more current sourced. In PFM mode, Main Control Loop 102 generates the control signal using a fixed-width pulse, with the frequency of the pulses varied to adjust the amount of current sourced to L103. The higher the frequency of the pulses, the more current is sourced to L 103.

In either mode of operation, Main Control Loop 102 updates the control signal after one or more cycles of the PWM or PFM signal. For example, in PWM mode, Main Control Loop 102 may adjust the pulse width of the PWM signal dependent on the voltage level of Vload 123 after each PWM cycle. In PFM mode, Main Control Loop 102 may adjust the frequency of the pulses after several cycles of the PFM signal.

L 103 corresponds to any suitable type of inductive device. L 103 may, in some embodiments, correspond to a discrete component, such as, for example, a wire coiled around a magnetic core, or a magnetic film wrapped around a length of wire. A discrete L 103 may be coupled to Main Control Loop 102 via, bond pads, terminals, or input/output pins. In other embodiments, L 103 may be fabricated on a same IC as Main Control Loop 102. Capacitor C 104, likewise, corresponds to any suitable type of capacitive device and may be a discrete component coupled to Main Control Loop 102, or fabricated on the same IC.

Load 105 receives Vload 123, in the illustrated embodiment, as a power supply signal. Load 105 may correspond to any active or passive circuit, including, but not limited to, a processor, a system-on-a-chip (SoC), an RF transceiver, or a sensor (e.g., light sensor, touch sensor, gyroscopic sensor, temperature sensor, and the like). At any given time, Load 105 may consume one of a wide variety of currents, depending on a current state of operation. If, for example, Load 105 corresponds to an SoC, then Load 105 may consume a small amount of current while in a reduced power state and a much larger amount of current when in a fully operational state. During a Ton time period, if Load 105 switches into a reduced power state, then excess current from L 103 may flow to C 104 rather than to Load 105. In contrast, if Load 105 switches from a reduced power state to a higher power state, thereby drawing more current than is flowing through L 103, then the additional current may be provided by C 104.

In some embodiments, Main Control Loop 102 may not be capable of regulating Vout 122 exactly to the desired voltage level for all current requirements of Load 105. Main Control Loop 102 may be designed for most efficient operation over one or two current ranges of Iload 124. In embodiments in which it is desired to maintain Vload 123 as close to the desired voltage level as possible, a secondary control loop may be included. Servo Control Loop 106 corresponds to a secondary control loop for Voltage Converter 100.

Servo Control Loop 106, in the illustrated embodiment, provides a secondary control loop to compensate for deviations from the desired voltage level of Vout 122 due to varying current demands from Load 105. During time of high current demand from Load 105, Servo Control Loop 106 may generate a control signal to increase an amount of current sourced to L 103. Like Main Control Loop 102, Servo Control Loop 106 receives indications of the amounts of current flowing through L 103 and uses this feedback to adjust an additional amount of current sourced L 103 to maintain the voltage level of Vout 122 closer to the desired level than Main Control Loop 102 may be capable of reaching alone.

As stated, both Main Control Loop 102 and Servo Control Loop 106 receive feedback indicating, either the voltage level of Vload 123, the current amount of Iload 124, or a combination of the two. As referred to herein, a time interval between each adjustment to their respective control signals by Main Control Loop 102 and Servo Control Loop 106 is referred to as a "time constant" of the respective loop. If both Main Control Loop 102 and Servo Control Loop 106 have similar time constants, then the resulting adjustments may overcompensate and cause the voltage level of Vout 122 to overshoot or undershoot the desired voltage level. For example, if both Main Control Loop 102 and Servo Control Loop 106 receive an indication that the level of Vload 123 is dropping below the desired level, then both Main Control Loop 102 and Servo Control Loop 106 may make independent adjustments to compensate for the drop, thereby generating too much compensation and causing the level of Vout 122 to rise above the desired voltage level. A subsequent feedback may indicate the overshoot, causing both Main Control Loop 102 and Servo Control Loop 106 to make adjustments to compensate for the overshoot, resulting in overcompensation that undershoots the desired voltage level of Vout 122. In some embodiments, this cycle of overshooting and undershooting may continue, resulting in an undesired oscillation on Vout 122 that propagates to Vload 123 and into circuits included in Load 105.

To prevent these undesired effects, in the present embodiment, Servo Control Loop 106 is designed with a time constant that is longer than that of Main Control Loop 102. By operating Servo Control Loop 106 with a longer time constant, adjustments made by Servo Control Loop 106 will not continuously overlap with adjustments by Main Control Loop 102 and may, therefore, avoid frequent occurrences of overcompensation and mitigate undesired overshoots and undershoots of the desired voltage level.

It is noted that the voltage converter illustrated in FIG. 1 is merely an example. Only components necessary to demonstrate the disclosed concepts are shown in FIG. 1. Additional and/or different components may be included in other embodiments. Furthermore, different configurations of components may be possible dependent upon the specific application for which the voltage converter is intended.

Figure 2:
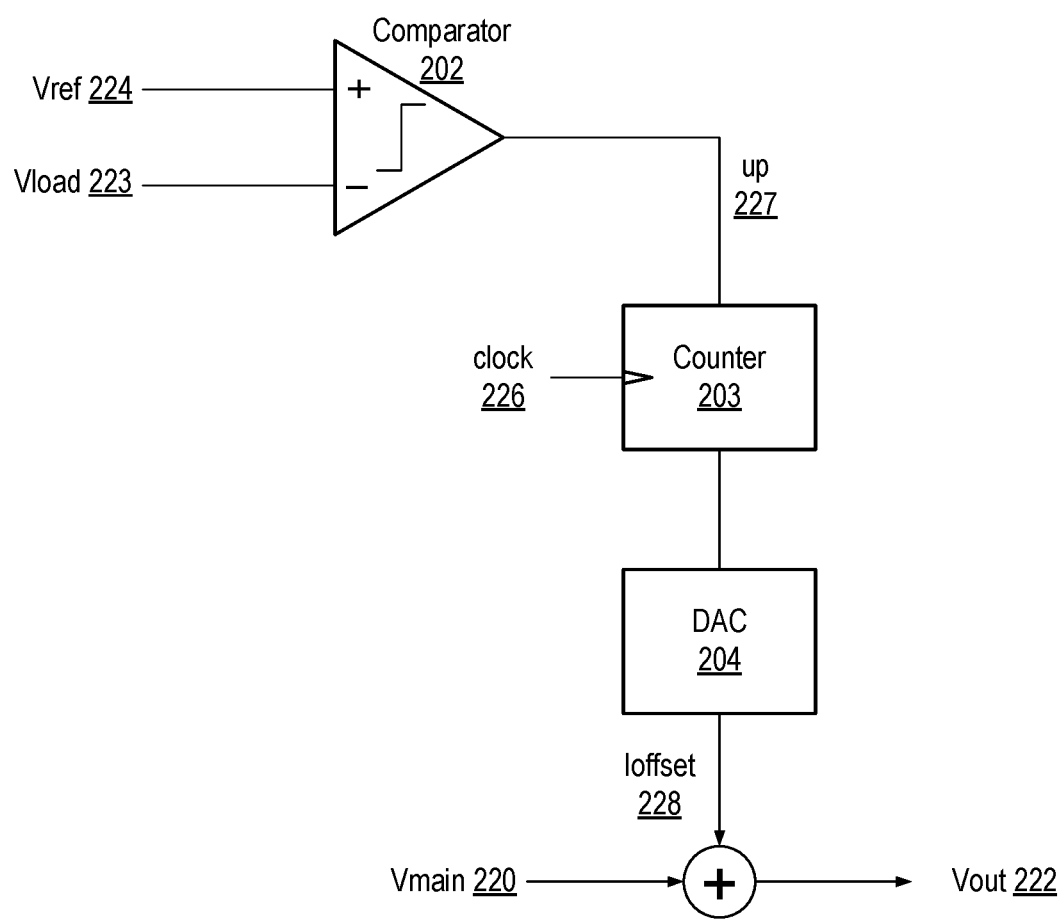
FIG. 2 shows a block diagram of an embodiment of a servo control loop circuit for a voltage converter.

Turning to FIG. 2, a block diagram of an embodiment of a servo control loop circuit for a voltage converter is illustrated. In some embodiments, Servo Control Loop 200 may correspond to at least a portion of Servo Control Loop 106 in FIG. 1. Servo Control Loop 200 includes Comparator 202 coupled to counting circuit (Counter) 203, which, in turn, is coupled to Digital-to-Analog Converter (DAC) 204. The DAC 204 generates offset current (Ioffset) 228 which is combined to an output of a main control loop (Vmain) 220 to generate output voltage (Vout) 222. Several signals are received as inputs, Vload 223, reference voltage (Vref) 224 and clock signal 226. Comparator 202 generates up signal 227.

Servo Control Loop 200, in the illustrated embodiment, compares voltage levels of received signals Vload 223 and Vref 224 using Comparator 202. Vref 224 may, in various embodiments, be generated as a signal with a constant voltage level, such as, for example, an output of a band-gap voltage reference, or an output of a voltage regulator. The voltage level of Vref 224 may be selected to correspond to a desired voltage level for Vload 223. Vload 223 may correspond to the voltage level of Vload 123 in FIG. 1, or, in other embodiments, may be proportional to the voltage level of Vload 123. For example, in one embodiment, Vref 224 may be generated by a band-gap voltage reference with a voltage level of 300 millivolts (mV). The desired voltage level for Vload 123 may be 1200 mV. In order to compare Vref 224 to Vload 223, Vload 223 may correspond to one-fourth of Vload 123, such that the level of Vload 223 is 300 mV when the level of Vload 123 is 1200 mV. Comparator 202 compares the voltage levels of Vload 223 and Vref 224. If the voltage level of Vload 223 is less than the voltage level of Vref 224, then Comparator 202 generates a logic high value on up signal 227, and otherwise generates a logic low on up signal 227.

It is noted that any one of various design styles may be used for Comparator 202. For example, Comparator 202 may employ a sense amplifier, an analog comparator, or any other suitable circuit for comparing the voltage levels of two or more signals.

Counter 203 receives up signal 227 from Comparator 202. A logic high value on up signal 227 causes Counter 203 to increment a count value in response to an active edge on clock signal 226, while a logic low value causes Counter 203 to decrement the count value in response to the active edge. As used herein, an "active edge" refers to a high-to-low transition or low-to-high transition on a given signal that causes a reaction in a circuit coupled to the given signal. In some embodiments, both high-to-low and low-to-high transitions may be active edges for a particular circuit.

The count value of Counter 203, in the illustrated embodiment, increments when the level of Vload 223 is less than the level of Vref 224 and decrements otherwise. As a result, a higher count value corresponds to the voltage level of Vref 224 being higher than the voltage level of Vload 223 for a longer time. Conversely, a lower count value corresponds to the level of Vref 224 being less than the level Vload 223 for a longer time.

The count value is received by DAC 204 from Counter 203. DAC 204, in one embodiment, is a current DAC that generates a particular amount of current (Ioffset current 228) based on the received count value. Higher count values correspond to a larger amount of Ioffset current 228 generated, and vice versa. Ioffset 228 is sourced into Vmain 220 to support generation of Vout 222. Vmain, in the illustrated embodiment, corresponds to an output from a main control loop, such as, for example, Main Control Loop 102 in FIG. 1. Vout 222 corresponds to Vout 122 in FIG. 1. The increased/decreased current to Vout 222 may result in a corresponding increase/decrease to the voltage level of Vload 223, thereby reducing/increasing a difference in the voltage level of Vload 223 from the voltage level of Vref 224. The comparisons repeat based on a time constant of Servo Control Loop 200. In the illustrated example, the desired time constant is used to determine a frequency of clock signal 226. As disclosed above in regards to FIG. 1, the time constant of Servo Control Loop 106 may be selected to be greater than the time constant of Main Control Loop 102.

In some embodiments, one or more count values from Counter 203 may be stored for later use. For example, a count value may be stored for a particular operational state of Load 105, such as, for example, when Load 105 is in a reduced power state and/or a fully operational state. A stored count value may be read and preloaded into a count register in Counter 203 when Load 105 is known to be returning to the corresponding state. In other embodiments, the stored value may be preloaded when Load 105 is predicted to reenter the corresponding state. For example, if Load 105 is presently in a high current operational state and switches to the reduced power state, Iload 124 may drop sharply. After a couple of Iload 124 measurements, Servo Control Loop 200 may determine that Load 105 has reentered the reduced power state based on the Iload 124 measurements, and preload the counter register with the stored count value for the reduced power state.

It is noted that the system illustrated in FIG. 2 is merely an example. In other embodiments, different functional blocks and different configurations of functions blocks are possible dependent upon the specific application for which the system is intended.

Figure 3:
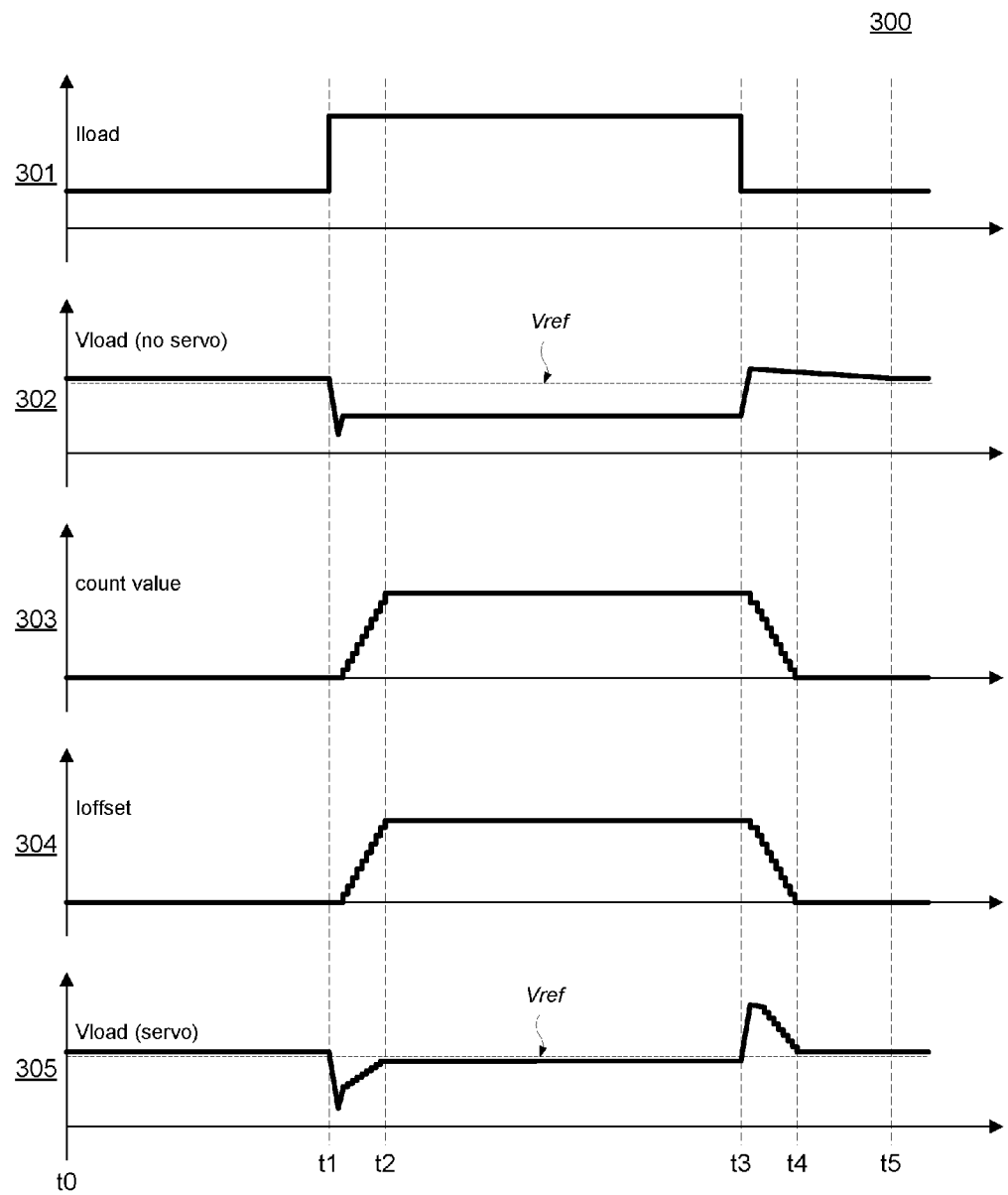
FIG. 3 illustrates a chart depicting waveforms for an embodiment of a voltage converter.

Moving to FIG. 3, a chart depicting waveforms for an embodiment of a voltage converter is shown. Chart 300 in FIG. 3 shows several waveforms associated with operation of a voltage converter, such as, for example, Voltage Converter 100 in FIG. 1, including a servo loop, such as, e.g. Servo Control Loop 200 in FIG. 2. Referring collectively to FIGS. 1-3, waveform 301 depicts Iload current 124 (y-axis), over time (x-axis). Waveform 302 depicts an embodiment of voltage (y-axis) versus time (x-axis) for Vload 223 with Servo Control Loop 200 inactive. A value (y-axis) for Counter 203 versus time (x-axis) is represented by waveform 303, while waveform 304 shows Ioffset current 228 supplied by DAC 204 over time. Waveform 305 illustrates an embodiment of voltage (y-axis) versus time (x-axis) for Vload 223 when Servo Control Loop 200 is active. Both waveforms 302 and 305 include a dashed line representing a voltage level for Vref 224.

In the illustrated embodiment with Servo Control Circuit 200 inactive, at time t0, Load 105 may be in a reduced power state, with a low current demand, as shown by Iload 301. Vload (no servo) 302 has a voltage level at or near Vref 224. At time t1, Load 105 switches into an operational state and Iload 301 increases rapidly. Vload (no servo) 302 drops suddenly, but recovers at least some of the voltage drop once Main Control Loop 102 reacts to the voltage drop and adjusts its control signal to compensate. Main Control Loop 302, however, is not able to compensate for the entire voltage drop, and Vload (no servo) 302 remains below Vref 224 until Load 105 returns to the reduced power state at time t3. At time t3, Vload (no servo) 302 rises rapidly in response to the reduced Iload 301, and over shoots Vref 224 by a small margin. Vload (no servo) 302 settles back to Vref 224 at time t5.

With Servo Control Loop 200 enabled, at time t0 with Load 105 in the reduced power state, count value 303 is at a low value. Ioffset 304, in response to the low count value 303, is also low, indicating Servo Control Loop 200 is providing little or no current into Load 105 since Main Control Loop 102 is able to generate Vload (servo) 302 at or near the desired voltage level. Again, at time t1, Load 105 enters an operational state and Iload 301 rises sharply. Vload (servo) 305 again drops and recovers just a portion of the voltage drop. Servo Control Loop 200 reacts to the difference between Vload (servo) 305 and Vref 224 by asserting up signal 227, thereby incrementing count value 303 in Counter 203. As count value 303 increases, DAC 204 increases Ioffset 304. Vload (servo) 305 increases in response to the increasing Ioffset 304, until Vload (servo) 305 is at or near the desired voltage level at time t2. In response, up signal 227 is de-asserted and count value 303 stops incrementing. In some embodiments, an additional stop signal (not shown) may be asserted to halt Counter 203. DAC 204 maintains Ioffset 304 at the level corresponding to the present count value 303.

At time t3, Load 105 returns to the reduced power state and Iload 301 drops accordingly. Due to the current being supplied by Ioffset 304, Vload 305 increases suddenly, overshooting Vref 224. In response, to the overshoot, up signal 227 is de-asserted, and Counter 203 begins to decrement count value 303. As count value 303 decrements, DAC 204 responsively reduces Ioffset 304. As Ioffset 304 is reduced, Vload (servo) 305 is also reduced, until Vload (servo) 305 is at or near Vref 224.

FIG. 3 is merely an example of waveforms that may result from the example embodiments as presented in this disclosure. The waveforms are simplified to provide clear descriptions of the disclosed concepts. In other embodiments, the waveforms may appear different due various influences such as technology choices for building the circuits, actual circuit design and layout, ambient noise in the environment, choice of power supplies, etc.

Figure 4:
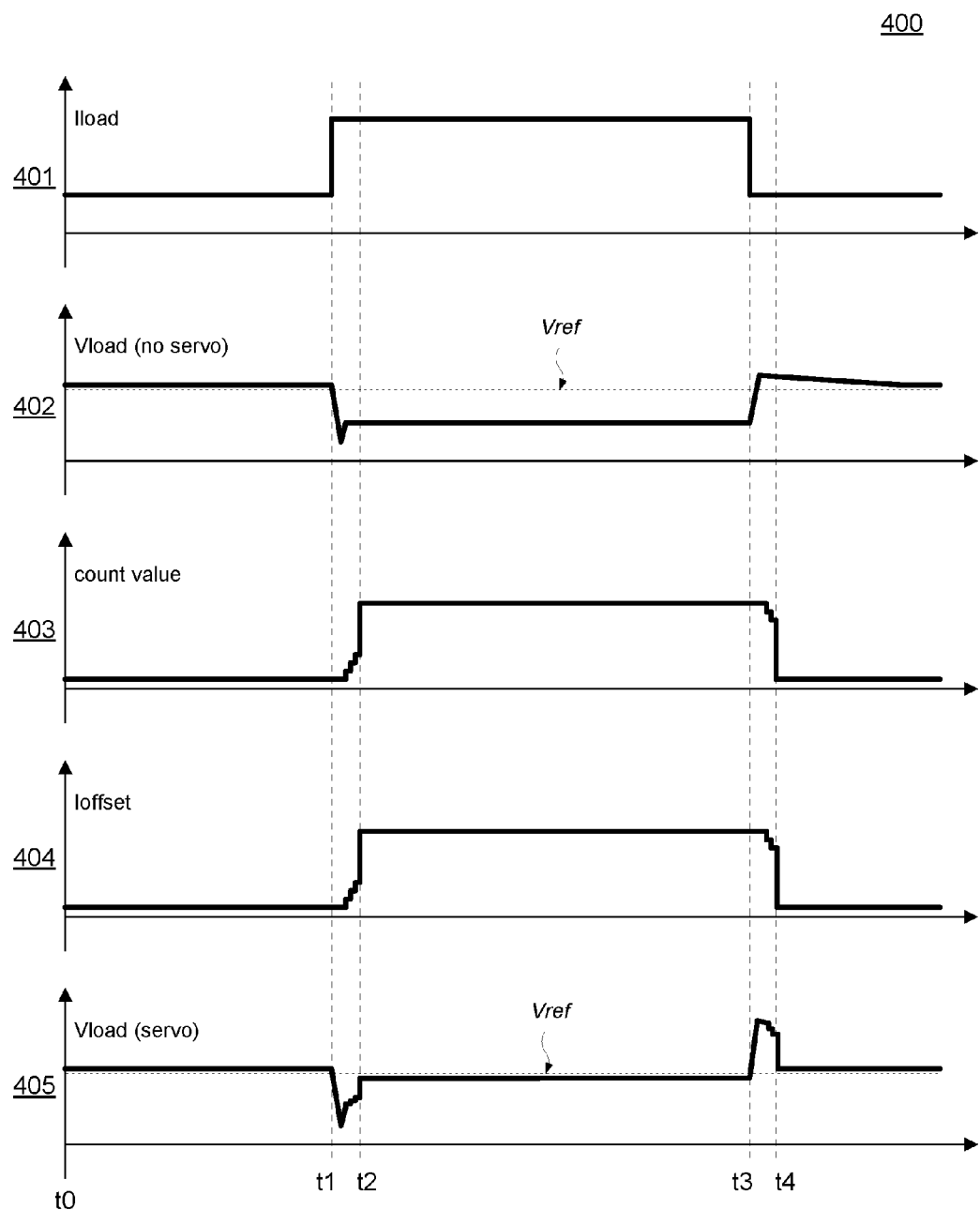
FIG. 4 shows a chart depicting waveforms for another embodiment of a voltage converter.

Turning now to FIG. 4, a chart depicting waveforms for another embodiment of a voltage converter is shown. Similar to Chart 300 in FIG. 3, Chart 400 in FIG. 4 also shows several waveforms associated with operation of a voltage converter, such as, for example, Voltage Converter 100 in FIG. 1, including a servo loop, such as, e.g. Servo Control Loop 200 in FIG. 2. The waveforms in FIG. 4 correspond to the similarly named and numbered waveforms of FIG. 3.

In the illustrated embodiment, Vload (no servo) 402 depicts a waveform corresponding to Vload 123 if Servo Control Loop 200 is inactive. The behavior of Vload (no servo) 402 relative to changes in Iload 401 is as described above in regards to FIG. 3. Vload (no servo) 402 is included in chart 400 as a comparison to Vload (servo) 405.

In an embodiment in which Servo Control Loop 200 is active, at time t0, Iload 401 is in a reduced power state and count value 403, Ioffset 404, and Vload (servo) 405 maintain steady values, with Vload (servo) 305 at or near Vref 224. At time t1, Load 105 enters an operational state and increases Iload 401 accordingly. Vload (servo) 405 drops in response to the increased current demand, followed by a partial recovery due to adjustments made by Main Control Loop 102. Up signal 227 is asserted in response to Vload (servo) 405 being below Vref 224, causing Counter 203 to increment count value 403. At time t2, however, instead of continuing to increment count value 403, Counter 203 reads and preloads a stored value corresponding to a previous occurrence of Load 105 entering an operational state. The stored value reduces a time for count value 403 to reach a point at which Ioffset 404 brings Vload (servo) 405 close to Vref 224.

At time t3, Load 105 returns to the reduced power state and Iload 401 falls sharply in response. The current of Ioffset 404 combined with the output from Main Control Loop 102 causes Vload 405 to rise quickly, overshooting Vref 224. In response, to the overshoot, the output of Comparator 202 changes, resulting in up signal 227 being de-asserted. In response to the de-assertion of up signal 227, Counter 203 begins decrementing count value 403, causing respective drops in Ioffset 404. At time t4, Counter 203 reads and preloads a count value that was stored at a previous time when Load 105 was in the reduced power state. The preloaded count value may again reduce a time for count value 403 to reach the point at which Ioffset 404 brings Vload (servo) 405 close to Vref 224.

It is noted that, FIG. 4 is an example of possible waveforms occurring from the operation of the embodiments presented in this disclosure. The waveforms are simplified for clarity. In other embodiments, the waveforms may appear different due various environmental conditions and/or the technology used to implement the circuits.

Figure 5:
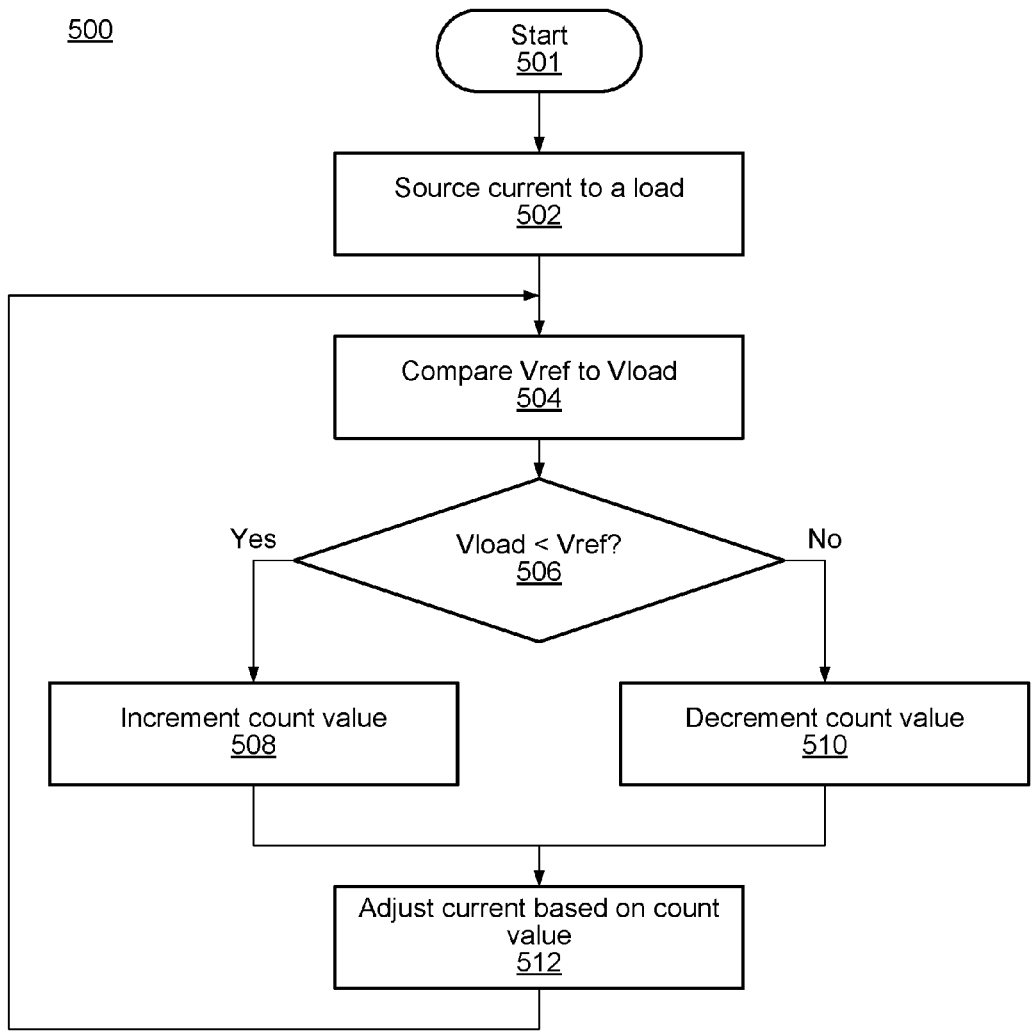
FIG. 5. illustrates a flow diagram depicting an embodiment of a method for operating a servo control loop circuit for a voltage converter.

Moving now to FIG. 5, a flow diagram depicting an embodiment of a method for operating a servo control loop circuit for a voltage converter is illustrated. Method 500 may be applied to a servo control loop, such as, for example, Servo Control Loop 200 in FIG. 2. Referring collectively to voltage converter 100 in FIG. 1, Servo Control Loop 200 in FIG. 2, and method 500 in FIG. 5, the method begins in block 501.

A current is sourced to a load (block 502). In one embodiment, Main Control Loop 102 sources a current to Load 105 via L103. Main Control Loop 102 monitors power consumed by Load 105 and makes periodic adjustments in order to maintain a voltage level of Vload 123 at or near a desired voltage level. Under some conditions, however, Main Control Loop 102 may not be able to keep the level of Vload 123 as close to the desired voltage level as desired. A secondary control loop, such as, for example, Servo Control Loop 106 may be utilized to assist Main Control Loop 102 in maintaining the voltage level of Vload 123 near the desired voltage level.

A voltage across a load is compared to a reference voltage (block 504). In one embodiment, Vload 223 is compared to Vref 224. In various embodiments, Vload 223 corresponds to Vload 123 or has a voltage level proportionate to the level of Vload 123. Similarly, the voltage level of Vref 224 either corresponds t0, or is proportionate t0, the desired voltage level of Vload 123. Comparator 202 compares Vload 223 to Vref 224 and asserts or de-asserts up signal 227 dependent upon the difference between the voltage levels of the two signals.

Further operations of method 500 may depend on a determination if the voltage level across the load is less than a reference voltage (block 506). Up signal 227 is asserted or de-asserted based on the comparison of the voltage levels of Vload 223 and Vref 224. If the level of Vload 223 is less than the level of Vref 224, then up signal 227 is asserted and the method moves to block 508 to increment a count value. Otherwise, up signal 227 is de-asserted and the method moves to block 510 to decrement a count value.

In response to determining that the voltage level across the load is less than a reference voltage, a count value is incremented (block 508). Up signal 227 is received by Counter 203. Clock signal 226 is also received by Counter 203 and a count value in Counter 203 is incremented in response to detecting an active edge of clock signal 226 while up signal 227 is asserted.

Otherwise, in response to determining that the voltage level across the load is greater than the reference voltage, the count value is decremented (block 510). Counter 203 decrements the count value in response to detecting an active edge of clock signal 226 while up signal 227 is de-asserted. In some embodiments, an additional stop signal (not shown) may be asserted if the voltage level of Vload 223 is within a predetermined threshold of the voltage level of Vref 224. In such an embodiment, Counter 203 neither increments nor decrements the count value upon detecting an active edge on clock signal 226. Counter 203 may, in some embodiments, not detect active edges of clock signal 226 if this stop signal is asserted.

An amount of current sourced to the load is adjusted based on the count value (block 512). After the count value has been incremented or decremented as described above, DAC 204 uses the new count value to adjust its output current, Ioffset 228. In some embodiments, DAC 204 may be implemented as a voltage DAC coupled to a transconductance device, such that a high voltage output of the voltage DAC, the more current is sourced through the transconductance device. In other embodiments, DAC 204 may be implemented as multiple current sources arranged in parallel, with each bit of the received count value enabling or disabling a respective device. The current generated by each transconductance device may be scaled, such that the most significant bit (MSB) of the count value controls the most current and the least significant bit (LSB) controls the least current. The method returns to block 504 to make another comparison between Vload 223 and Vref 224.

It is noted that the method illustrated in FIG. 5 is one example for demonstration purposes. Only the operations necessary to illustrate the disclosed concepts are shown. In various other embodiments, additional operations may be included. Some operations may be performed in a different sequence or in parallel.

Figure 6:
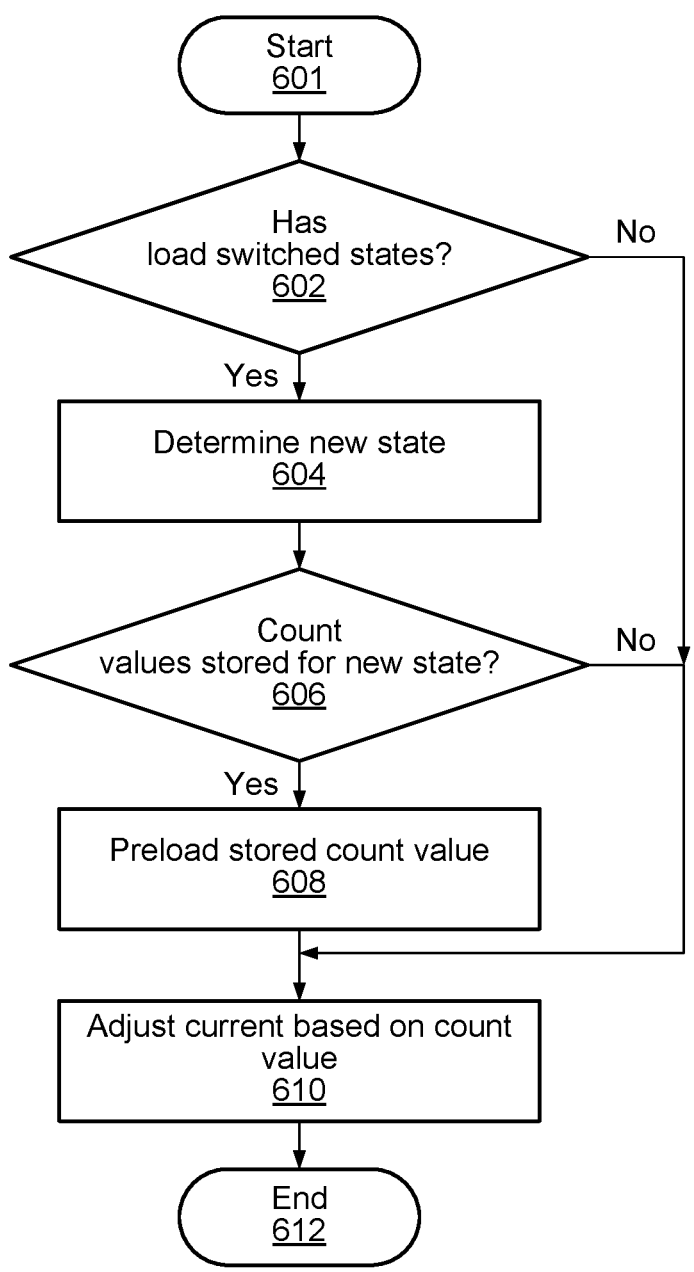
FIG. 6 shows a flow diagram illustrating an embodiment of a method for updating a count value in a servo control loop circuit.

Turning to FIG. 6, a flow diagram for an embodiment of a method for updating a count value in a servo control loop circuit is illustrated. Method 600 may correspond to operations performed in an embodiment of block 512 in FIG. 5, and may also be applied to a servo control loop, such as, e.g., Servo Control Loop 200 in FIG. 2. Referring collectively to voltage converter 100 in FIG. 1, Servo Control Loop 200 in FIG. 2, and method 600 in FIG. 6, the method begins in block 601.

Operations of the method may depend on a determination if the load has changed operating states (block 602). A control circuit in Counter 203 may detect a change in the operational state of Load 105. In some embodiments, a processor or other logic in Load 105 may send a signal to Servo Control Loop 200 indicating a change in the operational state of Load 105. In other embodiments, the control circuit in Counter 203 may predict the change of state by comparing recent values of up signal 227 from two or more recent active edges of clock signal 226. If a new operational state is determined, then the method moves to block 604 to determine which operational state Load 105 has entered. Otherwise, the method moves to block 610 to adjust Ioffset 228 based on the present count value.

Upon detecting a change of state, the new state of the load is determined (block 604). In some embodiments, the signal indicating the change in the operational state of Load 105 includes a value corresponding to the new state. In other embodiments where no indication of the new operating state is received, the control circuit in Counter 203 makes a determination of the new state. In various embodiments, the control circuit may use, for example, samples of up signal 227, measurements of Iload 124, measurements of Vload 123, or other indicators for determining the new operational state. For example, the control circuit may count a number successive active edges of clock signal 226 in which the state of up signal 227 does not change state to determine if Load 105 has entered a higher current or lower current state. A string of five successive active edges of clock signal 226 in which up signal 227 is asserted may indicate that Load 105 has switched from a reduced power state to a higher power active state. Likewise, a similar count of up signal 227 being de-asserted may indicate a switch from the active state to the reduced power state. In other embodiments, Iload 124 or Vload 123 may be measured or compared to a reference signal and an amount of a change in either signal may indicate a present operational state. If Load 105 has more than two operational states, then, in some embodiments, the control circuit in Counter 203 may not determine an exact operational state, but only if the switch is to a higher power or lower power state.

Further operations of method 600 may depend on a determination if a count value has been stored for the new state (block 606). The control circuit in Counter 203 determines if a count value has been stored that corresponds to the new state. A count value may be stored during a previous occurrence of the new state. If Load 105 has not previously entered the new state, then a corresponding count value for preloading may not exist. If a corresponding count value has been stored, then the method moves to block 608 to preload the stored count value. Otherwise, the method moves to block 610 to adjust Ioffset 228 based on the present count value.

The stored count value is preloaded into the counter (block 608). The stored count value is read from its storage location and loaded into a count register in Counter 203. In various embodiments, the count values may have been stored into a Random Access Memory (RAM), or into one or more registers in Voltage Converter 100. In some embodiments, only a single count value may be stored for a predetermined operational state or a most frequently encountered operational state. In other embodiments, respective count values for any suitable number of possible operational states may be stored.

An amount of current sourced to the load is adjusted based on the count value (block 610). DAC 204 uses the present count value to adjust Ioffset 228. The present count value may correspond to either the preloaded value or the count value upon the start of method 600. The method ends in block 612.

It is noted that the method illustrated in FIG. 6 is merely an example. Only operations for illustrating the disclosed concepts are included. In some embodiments, two or more operations may be performed in a different sequence or in parallel. Additional operations may be included in other embodiments.

Figure 7:
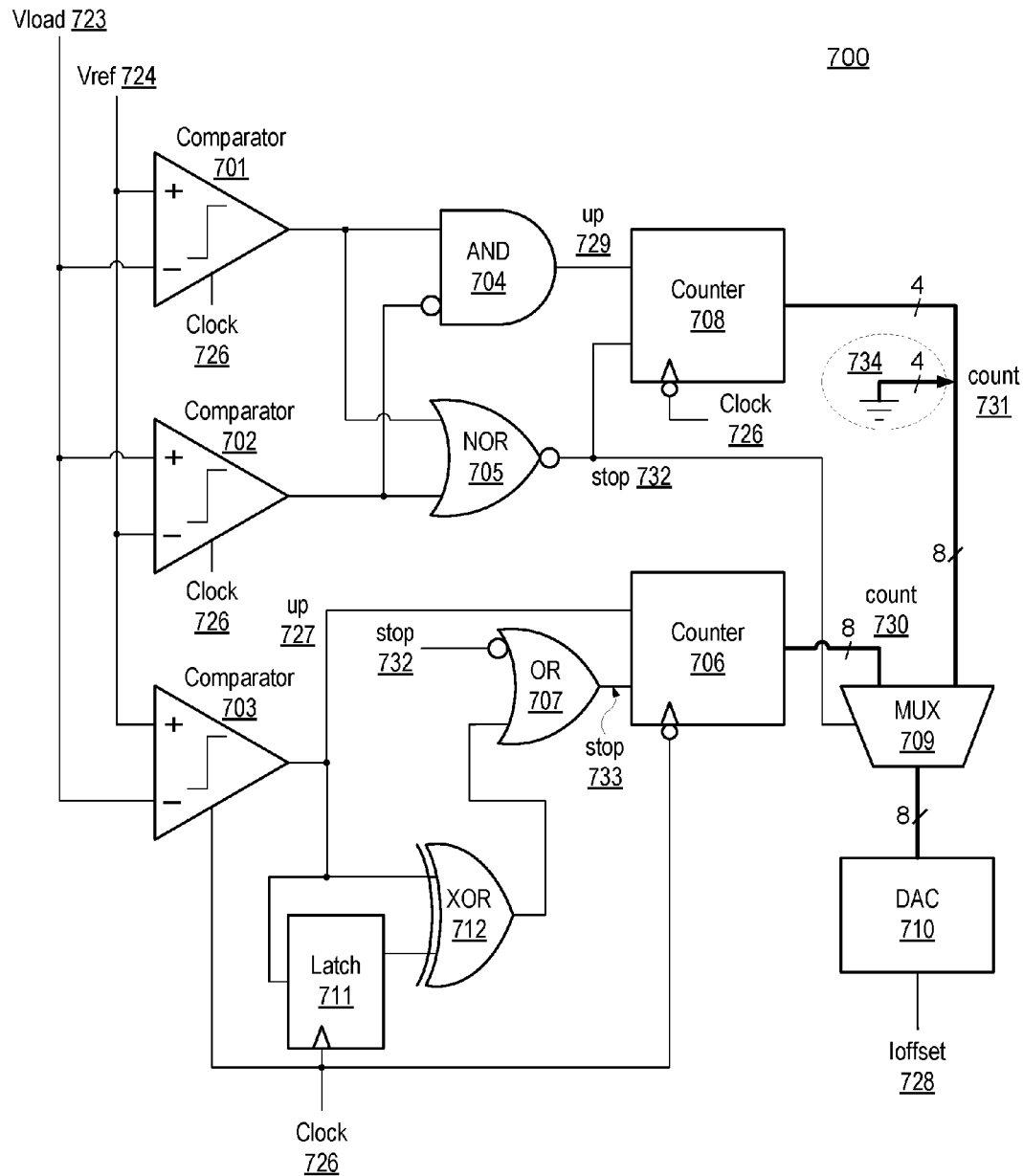
FIG. 7 depicts a block diagram of another embodiment of a servo control loop circuit for a voltage converter.

Moving to FIG. 7, a block diagram of another embodiment of a servo control loop circuit for a voltage converter is illustrated. Servo Control Loop 700 may correspond to another embodiment of Servo Control Loop 106 in FIG. 1. In the illustrated embodiment, Servo Control Loop includes three comparison circuits, Comparators 701 and 702 coupled to AND logic gate (AND) 704 and NOR logic gate (NOR) 705, as well as Comparator 703 coupled to counting circuit (Counter) 706, to latching circuit (Latch) 711, and to XOR logic gate (XOR) 712. NOR 705 is coupled to a second counting circuit (Counter) 708, to OR logic gate (OR) 707 (via stop signal 732), and to multiplexing circuit (MUX) 709. MUX 709 is coupled to digital-to-analog converter (DAC) 710. Signals Vload 723 and Vref 724 are received by Servo Control Loop 700, while Ioffset 728 is generated as an output.

In the illustrated embodiment, Servo Control Loop 700 includes two modes of operation, an LSB mode and an MSB mode. The active mode is determined based on comparisons of the voltage levels of Vload 723 and Vref 724. Comparators 701-703 are each clocked on a rising edge of clock signal 726, although, in other embodiments, each may be clocked on a falling edge instead. In response to a rising edge of clock signal 726, Comparator 701 samples voltage levels of Vload 723 and Vref 724 and asserts its output if the level of Vref 724 is more than a predetermined threshold greater than the level of Vload 723, and otherwise, de-asserts its output. Comparator 702 performs a similar, but opposite function, asserting its output if the level of Vload 723 is more than the predetermined threshold greater than the level of Vref 724, and otherwise, de-asserts its output. NOR 705 receives the outputs from Comparators 701 and 702 and asserts stop signal 732 if both outputs are low, and otherwise de-asserts stop signal 732. In other words, if the voltage level of Vload 723 is more than the predetermined threshold away from the voltage level of Vref 724, either higher or lower, then stop signal 732 is de-asserted. If, however, the voltage level of Vload 723 is within the predetermined threshold of Vref 724, then stop signal 732 is asserted.

When stop signal 732 is asserted, in the illustrated embodiment, Servo Control Loop is in LSB mode, and Counter 708 is halted, i.e., both increments and decrements are stopped. Counter 706 may be allowed to run, either incrementing or decrementing count value 730 dependent on the state of up signal 727. Comparator 703 samples the voltage levels of Vload 723 and Vref 724 in response to a rising edge on clock signal 726. Comparator 703 asserts up signal 727 if the level of Vref 724 is greater than the level of Vload 723, and otherwise de-asserts up signal 727. Counter 706 increments (if up signal 727 is asserted) or decrements (if up signal 727 is de-asserted) count value 730 in response to a falling edge on clock signal 726. In the illustrated embodiment, count value 730 is shown as an 8-bit value, but, in other embodiments, may be any suitable number of bit, matching a number of bits used by DAC 710. The assertion of stop signal 732 also causes MUX 709 to pass count value 730 to DAC 710. DAC 710, in turn, adjusts Ioffset 728 based on count value 730. DAC 710 may be implemented similar to DAC 204 in FIG. 2, and, therefore, the description of DAC 204 may also correspond to DAC 710.

Counter 706, however, halts if stop signal 733 is asserted. OR 707 asserts stop signal 733 based on states of stop signal 732 and an output of XOR 712. If stop signal 732 is de-asserted or the output of XOR 712 is asserted, then stop signal 733 is asserted and Counter 706 is halted. In the illustrated embodiment, Latch 711 captures the state of up signal 727 in response to a rising edge of clock signal 726 (in other embodiments, Latch 711 may be clocked on a falling edge instead). XOR 712 receives up signal 727 from Comparator 703 and the output of Latch 711. Since both Comparator 703 and Latch 711 sample on the rising edge of clock signal 726, the output of Comparator 703 changes after Latch 711 captures a state of up signal 727. Latch 711, therefore, holds a previous state of up signal 727. XOR 712 asserts its output if the current state of up signal 727 is different than the latched state in Latch 711. XOR 712, therefore, asserts its output when the state of up signal 727 changes from one clock cycle to the next. If the voltage levels of Vload 723 and Vref 724 are close, then the state of up signal 727 may toggle back and forth between asserted and de-asserted on each rising edge of clock signal 726. The toggling of up signal 727 may then result in the output of XOR 712 and the state of stop signal 733 to remain asserted, thereby halting Counter 706. This halting of Counter 706 in response to toggling of up signal 727 may prevent unnecessary adjustments to Ioffset 728 when the level of Vload 723 is close to Vref 724, possibly preventing additional ripples in the voltage level of Vload 723.

In the illustrated embodiment, when stop signal 732 is de-asserted, Servo Control Loop is in MSB mode, and Counter 706 is halted. Counter 708 is allowed to increment or decrement count value 731 dependent on the state of up signal 729. The state of up signal 729 is determined by the output of AND 704. AND 704 receives the output of Comparator 701 and the inverse of the output Comparator 702. Up signal 729, therefore, is asserted when the voltage level of Vload 723 is more than the predetermined threshold below the level of Vref 724, and is de-asserted otherwise. On falling edges of clock signal 726 (or rising edges in other embodiments), Counter 708 increments or decrements count value 731 based on the state of up signal 729. Count value 731, in the illustrated embodiment, is comprised of four bits from Counter 708 and an additional four grounded bits 734 (i.e., data values of '0'). The two sets of four bits are concatenated to create an 8-bit count value 731, with the four grounded bits 734 used as LSBs and the four bits from Counter 708 used as MSBs. By using this arrangement, the value of count value 731 increments or decrements by 16 rather than by one as count value 730 does.

When stop signal 732 is de-asserted, MUX 709 passes count value 731, rather than count value 730, to DAC 710. When operating in MSB mode, the accelerated changes of count value 731 may cause DAC 710 to increase or decrease Ioffset 728 faster, which in turn, may compensate for a voltage drop or voltage spike on Vload 723 more rapidly than when Servo Control Loop is in LSB mode.

It is noted that the count values used in the illustrated embodiment are each 8-bits. In other embodiments, any suitable size of counters and DAC may be utilized. In addition, in MSB mode, the number of bits set to '0' versus the number of bits provided by Counter 708 may vary according to the needs of a particular application.

It is also noted that the system illustrated in FIG. 7 is merely an example. In other embodiments, different functional blocks and different configurations of functions blocks are possible dependent upon the specific application for which the system is intended. In various embodiments, other combinations of logic gates may be used in place of AND 704, NOR 705, OR 707, or XOR 712 to produce similar functionality.

Figure 8:
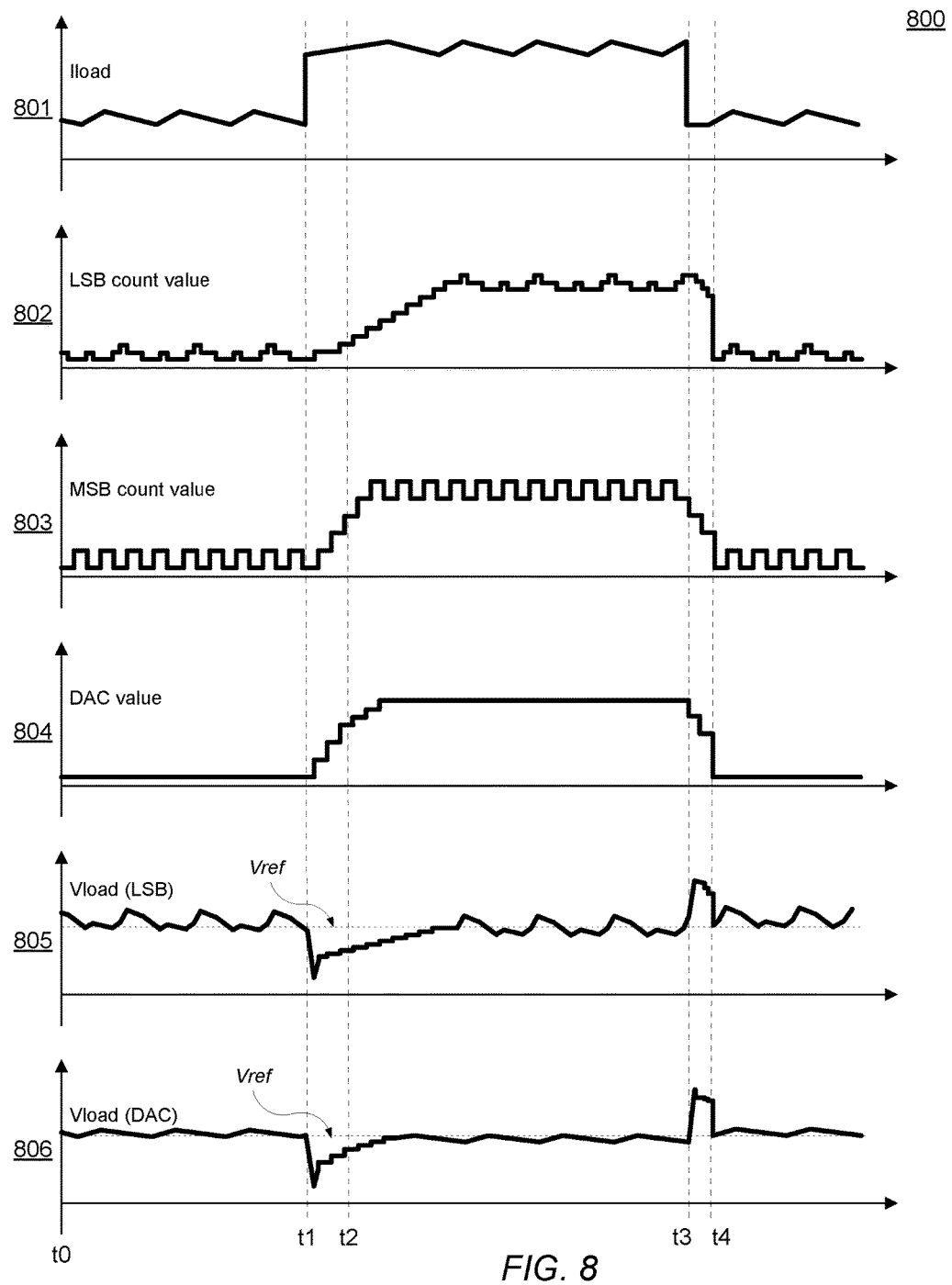
FIG. 8 illustrates a chart depicting waveforms for another embodiment of a voltage converter.

Turning now to FIG. 8, a chart illustrating waveforms for another embodiment of a voltage converter is shown. Similar to Chart 300 in FIG. 3 and Chart 400 in FIG. 4, Chart 800 in FIG. 8 shows several waveforms associated with operation of a voltage converter, such as, for example, Voltage Converter 100 in FIG. 1. as well as a servo loop, such as, e.g. Servo Control Loop 700 in FIG. 7. Referring collectively to FIGS. 1, 7, and 8, Chart 800 includes waveform 801 depicting Iload current 124 (y-axis), over time (x-axis). A value (y-axis) for LSB Counter 706, versus time (x-axis) is represented by waveform 802, while waveform 803 shows a value (y-axis) for MSB Counter 708, versus time (x-axis). Waveform 804 illustrates a value sent to DAC 710 via MUX 709. Waveform 805 depicts an embodiment of voltage (y-axis) versus time (x-axis) for Vload 723 if only LSB Counter 706 is used to provide values to DAC 710. Waveform 806, in contrast, shows an embodiment of voltage (y-axis) versus time (x-axis) for Vload 223 when Servo Control Loop 700 is fully active. Both waveforms 805 and 806 include a dashed line representing a voltage level for Vref 724.

At time t0, Load 105 may be in a reduced power state and Iload 801 is at a lower state. It is noted that Iload 801 and other waveforms in Chart 800 depict series of ripples in the waveforms. In various embodiments, Load 105 may not consume an absolutely steady amount of current. As circuits in Load 105 are activated and deactivated, current consumption may vary, even in some reduced power states. In addition, Main Control Loop 102 may not produce a perfect DC voltage level, and may instead produce a periodic ripple into Vout 122 which propagates into Iload 801 as shown. This periodic ripple may be detected by Servo Control Loop 700 and cause Counter 706 or MSB Counter 708 to increment and decrement in response to these ripples, as shown in LSB count value 802 and MSB count value 803.

It is noted that the count values illustrated in waveforms 802 and 803 assume that Counters 706 and 708 are not halted, i.e., stop signals 732 and 733 are not asserted. The oscillations that occur in LSB count value 802, if propagated to DAC 710, can cause more pronounced ripples on Vload (LSB) 805. This sort of negative feedback could cause even more ripples in Iload 801 which could then be detected by Servo Control Loop 700 causing even more exaggerated feedback and introducing more undesired oscillations on Vload (LSB) 805. The circuit elements Latch 711 and XOR 712 may mitigate this ripple feedback by asserting stop signal 733 if up signal 727 oscillates between asserted and de-asserted states.

DAC value 804 shows how Latch 711 and XOR 712 may help to mitigate the ripple feedback depicted in waveforms 802 and 803. DAC value 804 is illustrated with the assumption that stop signals 732 and 733 are asserted as described in regards to FIG. 7. The relatively stable current of Iload 801 results in Servo Control Loop 700 operating in LSB mode, with stop signal 732 asserted and MSB Counter 708 halted. In addition, Latch 711 and XOR 712 may work to reduce the oscillations in LSB count value 802 such that DAC 710 receives a relatively stable count value 730 from MUX 709, creating a stable output of Ioffset 728, resulting in Vload (DAC) 806 being more stable than Vload (LSB) 805.

At time t1, Load 105 may switch into a higher power state, causing Iload 801 to rise sharply. The sharp rise in Iload 801 causes a corresponding fall in Vload (DAC) 806. The difference between Vload (DAC) 806 and Vref, in the illustrated embodiment, is large enough to cause comparator 701 to assert its output, thereby resulting in the de-assertion of stop signal 732 and the assertion of stop signal 733, putting Servo Control Loop into MSB mode. MUX 709 switches to count value 731 (i.e., MSB count value 803) from Counter 708. Since MSB count value 803 increments by 16 rather than by 1, the value rises faster, as shown by the difference between waveforms 802 and 803. In response to the increasing values of DAC value 804, Ioffset 728 increases at the same rate, causing Vload (DAC) 806 to rise. At time t2, Vload (DAC) 806 reaches a voltage level high enough to cause Comparator 701 to de-assert, thereby asserting stop signal 732 and switching Servo Control Loop 700 back into LSB mode. MUX 709 switches back to passing count value 730 (LSB count value 802) to DAC 710. The smaller increments of LSB count value may produce a smoother rise in the level of Vload (DAC) and may prevent overshooting the level of Vref.

Between times t2 and t3, Vload (DAC) may reach a stable voltage level, until time t3, when Load 105 re-enters the reduced power state, causing a sharp drop in Iload 801. The combination of the present level of Ioffset 728 and the sudden decrease in Iload 801, Vload (DAC) 806 rises sharply, well above Vref. This difference between Vload (DAC) 806 and Vref causes Comparator 702 to assert its output, which in turn, de-asserts stop signal 732 and puts Servo Control Loop 700 back into MSB mode. Since Vload (DAC) 806 is greater than Vref, up signal 729 is de-asserted and Counter 708 decrements its count value. MSB count value 803 is passed by MUX 709 to DAC 710. Since MSB count value 803 decrements by 16, Ioffset 728 is reduced quickly, causing Vload (DAC) 806 to fall in response. At time t4, however, Servo Control Loop 700 may detect the state change of Load 105. If a count value was stored before time t1, then Servo Control Loop 700 may preload this stored count value, resulting in DAC value 804 falling sharply and bringing Vload (DAC) 806 back down to Vref quickly.

In various embodiments, control circuits in both Counter 706 and Counter 708 may store count values, while in other embodiments, a count value may be stored for one counter or the other. Servo Control Loop may, in some embodiments, switch into LSB mode upon preloading a count value, while in other embodiments, the switch to LSB mode may occur normally, after stop signal 732 asserts.

It is noted that, FIG. 8 is merely an example of possible waveforms. The waveforms may be simplified and/or exaggerated to clearly illustrate the disclosed concepts. In other embodiments, the waveforms may appear different due various environmental conditions and/or the technology used to implement the circuits.

Figure 9:
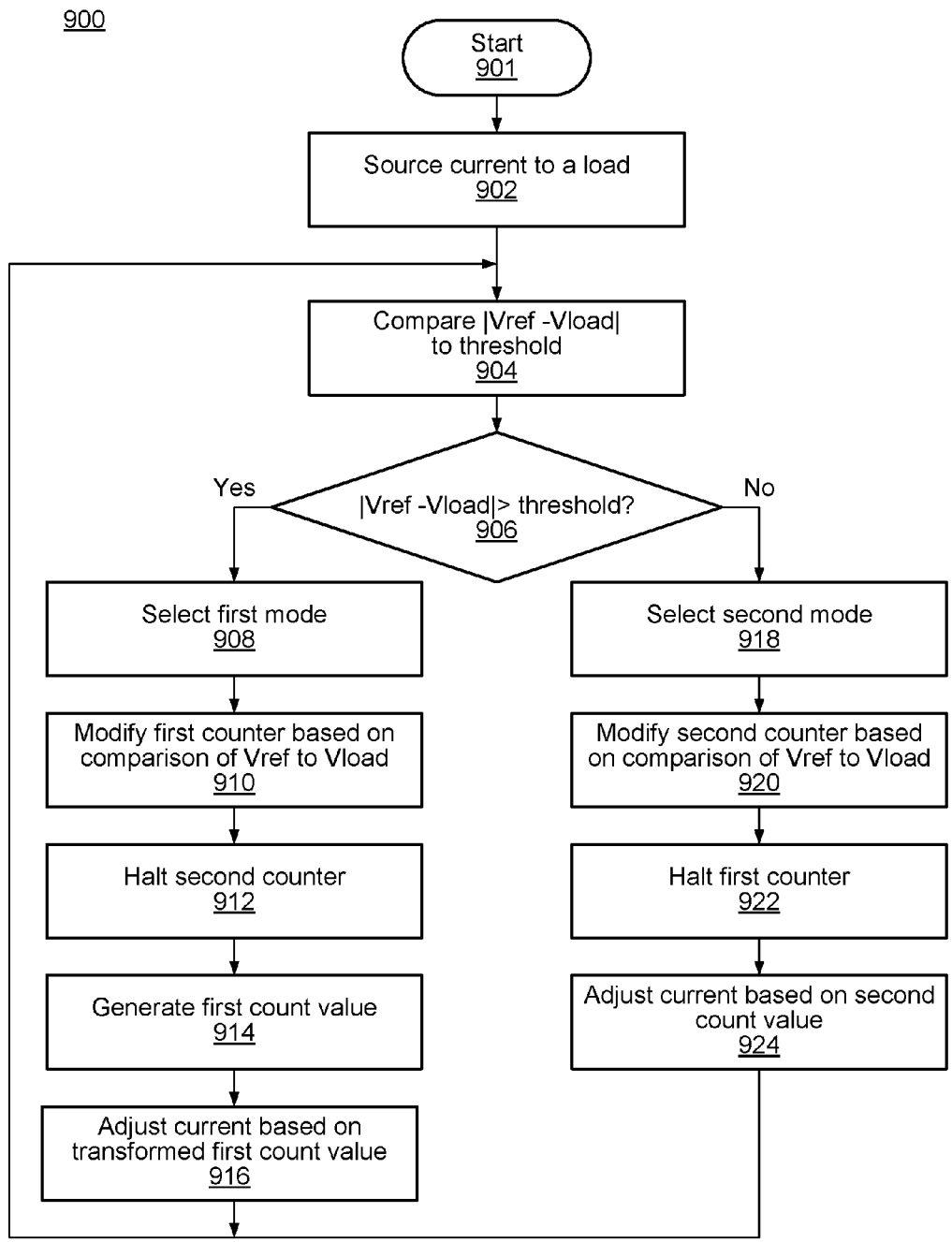
FIG. 9 shows a flow diagram depicting an embodiment of a method for operating a servo control loop circuit for a voltage converter.

Moving now to FIG. 9, a flow diagram for an embodiment of a method for operating a servo control loop circuit for a voltage converter is illustrated. Method 900 may be applied to a servo control loop, such as, for example, Servo Control Loop 700 in FIG. 7. Referring collectively to voltage converter 100 in FIG. 1, Servo Control Loop 700 in FIG. 7, and method 900 in FIG. 9, the method begins in block 901.

A current is sourced to a load (block 902). In one embodiment, Main Control Loop 102 sources a current to Load 105 via L103. Main Control Loop 102 monitors power consumed by Load 105 and makes periodic adjustments in order to maintain a voltage level of Vload 123 at or near a desired voltage level. The periodic adjustments may cause, in some embodiments, ripples in Vload 123. Under some conditions, however, Main Control Loop 102 may not be able to keep the level of Vload 123 as close to the desired voltage level as desired. A secondary control loop, such as, for example, Servo Control Loop 106 may be included to provide additional current to Iload 124 to help maintain the voltage level of Vload 123 near the desired voltage level.

A difference between a load voltage and a reference voltage is compared to a threshold value (block 904). In various embodiments, Vload 723 may correspond to Vload 123 or have a voltage level proportionate to the level of Vload 123. Similarly, the voltage level of Vref 724 either corresponds t0, or is proportionate t0, the desired voltage level of Vload 123. In one embodiment, Comparator 701 subtracts Vref 724 from Vload 723, while Comparator 702 subtracts Vload 723 from Vref 724. Each comparator compares its respective difference to a predetermined threshold and asserts its corresponding output if the difference is greater than the threshold.

Further operations of method 900 may depend on a determination if the difference between voltages is greater than the threshold value (block 906). Each of Comparators 701 and 702 determines a difference in voltage levels of Vload 723 and Vref 724. If either determined difference is greater than the threshold, then stop signal 732 is de-asserted and the method moves to block 908 to select a first mode. Otherwise, stop signal 732 is asserted and the method moves to block 918 to select a second mode.

If either determined difference is greater than the threshold, then the first mode is selected (block 908). If either Comparator 701 or Comparator 702 asserts its respective output, then stop signal 732 is de-asserted and Servo Control Loop 700 is in MSB mode. The de-assertion of stop signal 732 causes an assertion of stop signal 733.

A count value of a first counter is modified based on a comparison of the load voltage and the reference voltage (block 910). In the illustrated embodiment, the output of Comparator 701 and the inverse of the output of Comparator 702 are received by AND 704. If the output of Comparator 701 is asserted and the output of Comparator 702 de-asserted, then AND 704 asserts up signal 729, causing Counter 708 to increment count value 731 in response to a falling transition on clock signal 726. Otherwise, up signal 729 is de-asserted and Counter 708 decrements count value 731 in response to a falling transition on clock signal 726.

A second counter circuit is prevented from incrementing or decrementing (block 912). Stop signal 733 is asserted which halts Counter 706, i.e., count value 730 is prevented from incrementing or decrementing. In some embodiments, the present count value 730 may be stored for later use.

The first count value is generated (block 914). To generate count value 731, an output of Counter 708 is concatenated with additional data bits with a fixed value. In the illustrated embodiment, Counter 708 generates a 4-bit count value that is concatenated with four grounded bits 734. The grounded bits 734 are placed in the four LSB positions and the output of Counter 708 is placed into the four MSB positions, creating the 8-bit count value 731. Since the 4-bit value in Counter 708 increments or decrements by one at each falling transition of clock signal 726, the 8-bit count value 731 effectively increments by 16 at each falling edge of clock signal 726.

An amount of current sourced to the load is adjusted based on the first count value (block 916). The de-assertion of stop signal 732 causes MUX 709 to pass count value 731 to DAC 710. DAC 710 uses the new count value to adjust its output current, Ioffset 728. Ioffset 728 is sourced to Load 105 to help support the Iload 124 demand from Load 105. The method returns to block 904 to make another comparison and repeat the process.

If, in block 906, neither determined difference is greater than the threshold, then the second mode is selected (block 918). If neither Comparator 701 nor Comparator 702 asserts its respective output, then stop signal 732 is asserted and Servo Control Loop 700 is in LSB mode. The assertion of stop signal 732 causes a de-assertion of stop signal 733.

A count value of the second counter is modified based on a comparison of the load voltage and the reference voltage (block 920). Comparator 703 receives and compares the voltage levels of Vload 723 and Vref 724, and asserts up signal 727 if the level of Vref 724 is higher. An asserted value of up signal 727 causes Counter 706 to increment count value 730 in response to a falling transition on clock signal 726. Otherwise, up signal 727 is de-asserted and Counter 706 decrements count value 730 in response to a falling transition on clock signal 726.

The first counter circuit is prevented from incrementing or decrementing (block 922). Stop signal 732 is asserted which halts Counter 708 similar to how Counter 706 is halted in block 912. Likewise, the present count value 731 may be stored for later use in some embodiments.

An amount of current sourced to the load is adjusted based on the second count value (block 924). The assertion of stop signal 732 causes MUX 709 to pass count value 730, rather than count value 731, to DAC 710. DAC 710 adjusts Ioffset 728 based on the new count value. Again, Ioffset 728 is sourced to Load 105 to help support the Iload 124 demand from Load 105. The method returns to block 904 to make another comparison and repeat the process.

It is noted that the method illustrated in FIG. 9 is an example for demonstrating disclosed concepts. Only operations for illustrating these concepts are included. In some embodiments, additional operations may be included. In other embodiments, two or more operations may be performed in parallel or in a different sequence.

Figure 10:
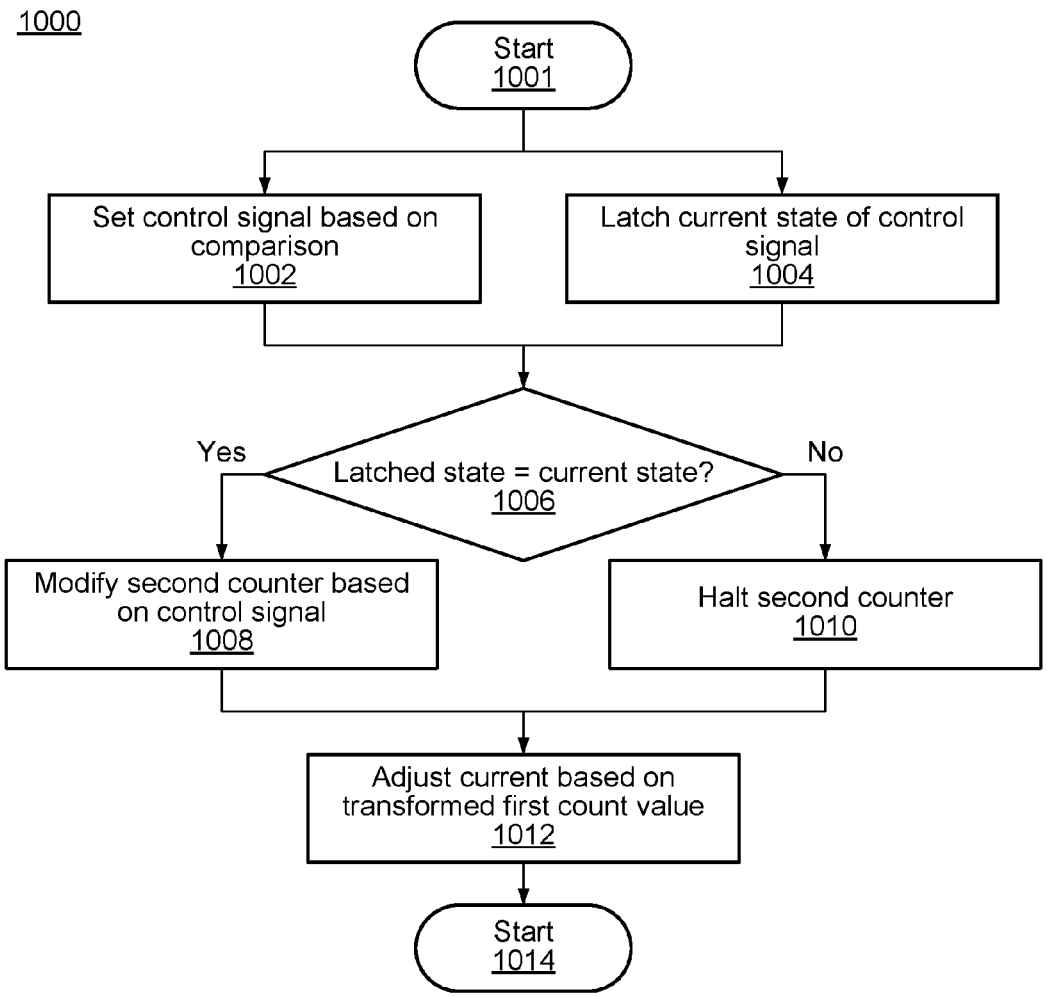
FIG. 10 depicts a flow diagram illustrating an embodiment of a method for operating a counter in a servo control loop circuit.

Turning to FIG. 10, a flow diagram for an embodiment of a method for operating a counter in a servo control loop circuit is shown. In some embodiments, Method 1000 may correspond to operation included in block 920 in the method of FIG. 9. Like Method 900, Method 1000 may be applied to a servo control loop, such as, for example, Servo Control Loop 700 in FIG. 7. Referring collectively to voltage converter 100 in FIG. 1, Servo Control Loop 700 in FIG. 7, and method 1000 in FIG. 10, the method begins in block 1001, with Servo Control Loop operating in LSB mode.

The load voltage and the reference voltage are compared to set a control signal (block 1002). Comparator 703 receives Vload 723 and Vref 724. The voltage levels of Vload 723 and Vref 724 are then compared at a rising transition of clock signal 726 to generate up signal 727. If the level of Vref 724 is higher than the level of Vload 723, then up signal 727 is asserted, and is de-asserted otherwise.

In parallel, a current state of a control signal is latched (block 1004). Latch 711 receives up signal 727 and latches a present state in response to a rising transition of clock signal 726. Since both Latch 711 and Comparator 703 act on the rising transition of clock signal 727, Latch 711 captures the state of up signal 727 before Comparator 703 sets a new state. The latched state becomes a stored previous state of up signal 727 once Comparator 703 sets the new state.

Further operations of the method may depend on the values of the latched state and present state of the control signal (block 1006). In the illustrated embodiment, XOR 712 receives the values for the latched state and present state of up signal 727. If the two values are the same, i.e., the state of up signal 727 did not change on the last rising transition of clock signal 726, then the output of XOR 712 is de-asserted. If the state of up signal 727 did change, then the output of XOR 712 is asserted. Since stop signal 732 is asserted in LSB mode, the state of stop signal 733 is dependent on the state of stop signal 732, assuming the same state as stop signal 732. If stop signal 733 is de-asserted, then the method moves to block 1008 to modify the second count value. Otherwise, if stop signal 733 is asserted, the method moves to block 1010 to halt the second counter.

If stop signal 733 is de-asserted, then the second counter value is modified based on the state of the control signal (block 1008). Counter 706 increments (if up signal 727 is asserted) or decrements (if up signal 727 is de-asserted) count value 730 in response to a falling transition of clock signal 726. Since Counter 706 modifies count value 730 on a falling transition of clock signal 726, up signal 727 and stop signal 733 have time to settle due to being updated on the rising transition.

If stop signal 733 is asserted, then the second counter is halted (block 1010). In the illustrated embodiment, stop signal 733, when asserted, causes Counter 706 to cease changes to count value 730. In some embodiments, stop signal 733 blocks transitions of clock signal 726 inside of counter 706. Count value 730 maintains its current value.

An amount of current sourced to the load is adjusted based on the second count value (block 1012). In LSB mode, MUX 709 passes count value 730 to DAC 710 to adjust Ioffset 728 based on the current count value 730. If stop signal 733 is de-asserted, then DAC 710 adjusts Ioffset 728. If, however, Counter 706 is halted, then DAC 710 maintains a present level of Ioffset 728. As previously disclosed, Ioffset 728 is sourced to Load 105 to help support the Iload 124 demand from Load 105. The method ends in block 1014.

It is noted that the method illustrated in FIG. 10 is one example. Only operations for illustrating the disclosed concepts are included. In various embodiments, additional operations may be included, and/or some operations may be performed in parallel or in a different sequence.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a driver circuit configured to source a current to a load circuit;
   a comparator circuit configured to perform a comparison of a reference voltage to a voltage across the load circuit; and
   a counter circuit configured to:
      modify a digital count value based on the comparison; and
      store a specific digital count value in response to an indication from the load circuit that at least a portion of the load circuit is switching from a first operating state to a second operating state;
   wherein the driver circuit is further configured to adjust an amount of the current sourced to the load circuit using the stored specific digital count value.

2. The apparatus of claim 1, wherein to indicate that the at least a portion of the load circuit is switching from the first operating state to the second operating state, the counter circuit is further configured to determine that the digital count value has been consecutively incremented for a particular number of clock cycles.

3. The apparatus of claim 1, wherein the counter circuit is further configured to:
   read the stored specific digital count value in response to an indication from the load circuit that the at least a portion of the load circuit is switching from the second operating state to the first operating state; and
   replace a present digital count value with the stored specific digital count value.

4. An apparatus, comprising:
   a driver circuit configured to source a current to a load circuit;
   a comparator circuit configured to perform a comparison of a reference voltage to a voltage across the load circuit;
   a first counter circuit configured to, modify a first count value based on the comparison;
   a second counter circuit configured to modify a second count value based on the comparison; and
   a logic circuit configured to, in response to a determination that a magnitude of a difference between the reference voltage and the voltage across the load circuit is greater than a threshold difference, select the first count value as a digital count value; and to otherwise select the second count value as the digital count value;
   wherein the driver circuit is further configured to adjust an amount of the current sourced to the load circuit using the digital count value from the first counter circuit.

5. The apparatus of claim 4, wherein to modify the first count value, the first counter circuit is further configured to:
   modify a portion of the first count value based on the comparison; and
   concatenate the portion of the first count value with a fixed constant value to generate the digital count value.

6. The apparatus of claim 4, wherein the logic circuit is further configured to assert a stop signal in response to a determination that a value of a control signal has toggled since a most recent modification of the second count value.

7. The apparatus of claim 6, wherein the second counter circuit is further configured to maintain a constant value of the digital count value in response to the assertion of the stop signal.

8. A method, comprising:
   sourcing, by a main control circuit, a current to a load circuit;
   performing, by a secondary control circuit, a comparison of a reference voltage to a voltage across the load circuit;
   modifying a digital count value based on the comparison;
   adjusting an amount of the current sourced to the load circuit using the digital count value; and
   storing a specific digital count value in response to determining that at least a portion of the load circuit is switching from a first mode of operation to a second mode of operation.

9. The method of claim 8, wherein determining that the at least a portion of the load circuit is switching from the first mode of operation to the second mode of operation comprises determining that the digital count value has been consecutively incremented for a particular number of clock cycles.

10. The method of claim 8, further comprising:
    reading the stored specific digital count value in response to determining that the at least a portion of the load circuit is switching from the second mode of operation to the first mode of operation; and
    replacing a present digital count value with the stored specific digital count value.

11. The method of claim 8, further comprising, at a first time, operating in a first mode in response to determining that a magnitude of a difference between the reference voltage and the voltage across the load circuit is greater than a threshold difference.

12. The method of claim 11, further comprising, in response to operating in the first mode:
    modifying a portion of a first count value based on the comparison; and concatenating the portion of the first count value with a fixed constant value to generate the digital count value; and selecting the concatenated first count value as the digital count value in response to determining that a magnitude of a difference between the reference voltage and the voltage across the load circuit is less than the threshold difference.

13. The method of claim 11, further comprising, at a second time:

operating in a second mode in response to determining that a magnitude of a difference between the reference voltage and the voltage across the load circuit is less than a threshold difference;

modifying a second count value in a manner based on the comparison; and selecting the second count value as the digital count value in response to determining that a magnitude of a difference between the reference voltage and the voltage across the load circuit is less than the threshold difference.

14. The method of claim 8, further comprising:

adjusting, by the main control circuit, the amount of the current sourced to the load circuit at a first frequency; and adjusting, by the secondary control circuit, the amount of the current using the digital count value at a second frequency;

wherein the second frequency is lower than the first frequency.

15. A system, comprising:

a processing circuit; and a voltage converter circuit including:

a main control circuit configured to source a current to the processing circuit; and a secondary control circuit configured to:

perform a comparison of a reference voltage to a voltage across the processing circuit;

modify a digital count value based on the comparison;

adjust an amount of the current sourced to the processing circuit using the count value; and store a specific digital count value in response to determining that at least a portion of the processing circuit is switching from a first mode of operation to a second mode of operation.

16. The system of claim 15, wherein to determine that the at least a portion of the processing circuit is switching from a first mode of operation to a second mode of operation, the secondary control circuit is further configured to determine that the count value has been consecutively incremented for a particular number of clock cycles.

17. The system of claim 15, wherein the secondary control circuit is further configured to:

read the stored specific digital count value in response to determining that the at least a portion of the processing circuit is switching from the second mode of operation to the first mode of operation; and replace a present digital count value with the stored specific digital count value.

18. The system of claim 15, wherein the secondary control circuit is further configured to operate in a first mode in response to a determination that a magnitude of a difference between the reference voltage and the voltage across the processing circuit is greater than a threshold difference, and otherwise operating in a second mode.

19. The system of claim 18, wherein, in response to operating in the first mode, the secondary control circuit is further configured to:

modify a portion of a first count value in a manner based on the comparison; and concatenate the portion of the first count value with a fixed constant value to generate the digital count value.

20. The system of claim 15, wherein the main control circuit is configured to adjust the amount of the current sourced to the processing circuit at a first frequency, wherein the secondary control circuit is further configured to adjust the amount of the current using the digital count value at a second frequency, and wherein the second frequency is less than the first frequency.

* * * * *